(12) United States Patent  
Bashirullah et al.

(10) Patent No.: US 8,330,632 B2
(45) Date of Patent: Dec. 11, 2012

(54) SELF-HEALING ANALOG-TO-DIGITAL CONVERTERS WITH BACKGROUND CALIBRATION

(75) Inventors: Rizwan Bashirullah, Gainesville, FL (US); Jikai Chen, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 132 days.

(21) Appl. No.: 13/025,855

(22) Filed: Feb. 11, 2011

(65) Prior Publication Data

US 2012/0206281 A1 Aug. 16, 2012

(51) Int. Cl.
H03M 1/10 (2006.01)

(52) U.S. Cl. .................. 341/120; 341/155; 341/159

(58) Field of Classification Search .................. 341/120, 341/155, 159
See application file for complete search history.

(56) References Cited

U.S. PATENT DOCUMENTS

| | | | |
|---|---|---|---|
| 7,064,693 B1 * | 6/2006 | Huang et al. .................. | 341/120 |
| 7,286,072 B2 * | 10/2007 | Sakata et al. .................. | 341/155 |
| 7,474,239 B2 * | 1/2009 | Su et al. .......................... | 341/120 |
| 7,652,600 B2 * | 1/2010 | Van der Plas et al. ........ | 341/120 |
| 7,688,237 B2 | 3/2010 | Cao et al. | |
| 7,773,010 B2 * | 8/2010 | Van der Plas et al. ........ | 341/120 |
| 8,040,263 B2 * | 10/2011 | Nakajima ...................... | 341/118 |
| 8,223,047 B2 * | 7/2012 | Lai et al. ......................... | 341/120 |

OTHER PUBLICATIONS

Cao, J., et al., "A 500mW Digitally Calibrated AFE in 65nm CMOS for 10Gb/s Serial Links over Backplane and Multimode Fiber," Feb. 2009, IEEE International Solid-State Circuits Conference, 3 pages.
Donovan, C., et al., "A "Digital" 6-bit ADC in 0.25-um CMOS," Mar. 2002, IEEE Journal of Solid State Circuits, vol. 37, No. 3, pp. 432-437.
Huang, C.-C., et al., "A Background Comparator Calibration Technique for Flash Analog-to-Digital Converters," Sep. 2005, IEEE Transactions on Circuits and Systems-I: Regular Papers, vol. 52, No. 9, pp. 1732-1740.
Kijima, M., et al., "A 6b 3GS/s Flash ADC with Background Calibration," 2009, IEEE Custom Integrated Circuits Conference, pp. 283-286.
Nakajima, N., et al, "A Background Self-Calibrated 6b 2.7 GS/s ADC With Cascade-Calibrated Folding-Interpolating Architecture," Apr. 2010, IEEE Journal of Solid State Circuits, vol. 45, No. 4, pp. 707-718.
Park, S., et al., "A 3.5 Gs/s 5-b Flash ADC in 90 nm CMOS," 2006, IEEE Custom Integrated Circuits Conference, pp. 489-492. Chen, H.-W., et al., "A 1-GS/s 6-Bit Two-Channel Two-Step ADC in 0.13-um CMOS," Nov. 2009, IEEE Journal of Solid State Circuits, vol. 44, No. 11, pp. 3051-3059.
Boni, A., et al., "Single-Reference Foreground Calibration of High-Resolution, High-Speed Pipeline ADCs," 2009, Circuits Syst Signal Process, vol. 28, pp. 1487-1504.
McNeill, J., et al., ""Split ADC" Architecture for Deterministic Digital Background Calibration of a 16-bit 1-MS/s ADC," Dec. 2005, IEEE Journal of Solid State Circuits, vol. 40, No. 12, pp. 2437-2445.
McNeill, J., et al., "Digital Background-Calibration Algorithm for "Split ADC" Architecture," Feb. 2009, IEEE Transactions on Circuits and Systems-I: Regular Papers, vol. 56, No. 2, pp. 294-306.
Enright, D., et al., "Digital Background-Calibration Algorithm for "Split ADC" Architecture," Jul. 2008, Fujitsu Sci. Tech. J., vol. 44, No. 3, pp. 1264-1273.

* cited by examiner

*Primary Examiner* — Khai M Nguyen
(74) *Attorney, Agent, or Firm* — Saliwanchik, Lloyd & Eisenschenk

(57) ABSTRACT

Calibration of an analog-to-digital converter (ADC) is accomplished via a reference comparator, a first and second multiplexer (MUX), and a finite state machine (FSM). By sampling an analog input with the reference comparator and comparing the results with those of the ADC using the FSM, all the comparators in the ADC can be calibrated without interrupting the ADC's normal operation. The first MUX provides a same reference voltage to the reference comparator as a comparator selected for the calibration, and the second MUX provides the FSM with the output of the selected comparator. The FSM then performs a comparison of the reference comparator and the selected comparator, extracts the polarity of the mismatch, and updates the contents of a memory with the extracted polarity. An offset control in the selected comparator receives a signal corresponding to the extracted polarity stored in the memory and injects offset current into the comparator.

20 Claims, 10 Drawing Sheets

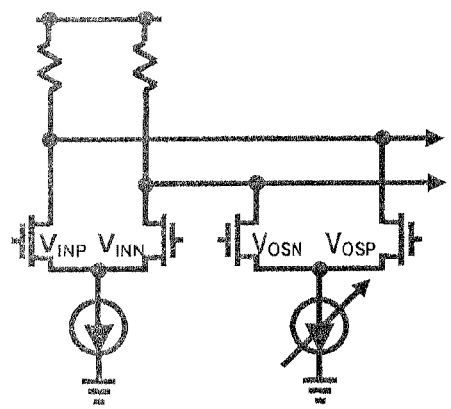
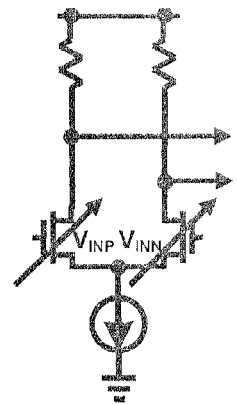
FIG. 11A
FIG. 11B
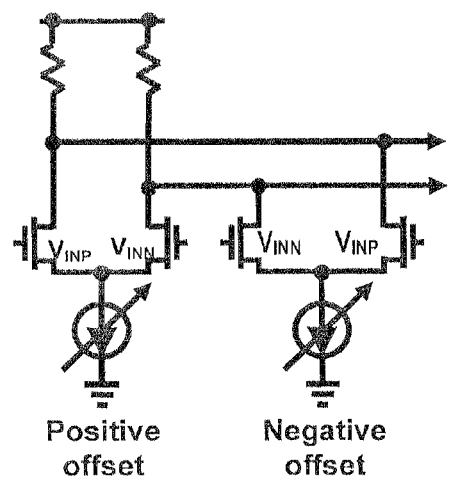
Positive offset     Negative offset
FIG. 11C

SELF-HEALING ANALOG-TO-DIGITAL CONVERTERS WITH BACKGROUND CALIBRATION

BACKGROUND OF THE INVENTION

In many applications, analog signals are processed in the analog domain, converted to digital, and then further processed in the digital domain. An analog front-end is a device (in the form of an integrated circuit (IC), separate chip, or stand alone package) that receives an analog signal and performs the analog-to-digital (A/D) conversion. The analog front-end often includes signal conditioning circuits as well.

Because of the continued scaling of CMOS technology, sampling of high speed signals directly at the analog front-end using analog-to-digital converters (ADCs) has been made possible. ADCs convert an analog input signal into a digital output signal by sampling the analog input signal at a sample rate and providing a digital representation of each sample to a specific resolution.

Once the high speed signals are sampled using the ADCs, subsequent signal processing such as equalization and timing recovery can then be accomplished in the digital domain. ADC's for such applications typically require high sample rates (>1 GS/s) at low resolution (4-6 bits), making the flash architecture an attractive choice. A flash ADC uses a linear voltage ladder with a cascaded comparator at each rung of the ladder to compare an input voltage to successive reference voltages, also referred to as thermometer code encoding. For an N-bit flash ADC, the analog front-end has $2^N-1$ identical comparators in parallel. The comparators are an array of parallel repetitive blocks. Here, the repetitive blocks are formed of comparators and often include pre-amps.

To save power and area while minimizing the ADC's input capacitance, it is highly desirable to use small transistors in the front-end. However, small transistors tend to lead to larger offsets in the comparators, which degrade the linearity of the ADC.

Therefore, effective offset calibration methods are of high interest in order to allow aggressive sizing without sacrificing performance.

ADC calibration can be categorized into foreground calibration and background calibration. A foreground calibration occurs in the signal path and interrupts the ADC operation. Additional device elements, such as switches, are typically arranged in the critical signal path for foreground calibration schemes. High hardware overhead may exist due to captive loads in the critical signal path. In contrast to the foreground calibration, a background calibration is able to track supply and/or temperature fluctuations continuously without interrupting the ADC operation. Some background calibrating techniques include noise injection, random chopping, dynamic comparator array configuration and digital smoothing. In certain background calibration schemes, switching elements are included in the critical signal path, which can degrade ADC performance.

Accordingly, research continues to be conducted to provide improved calibration methods for ADCs.

BRIEF SUMMARY

The invention relates to calibration techniques and circuits applicable to self-healing ADCs. Embodiments of the invention provide improved flash ADCs and background calibration methods of flash ADCs.

According to one aspect of an embodiment of the invention, a calibration method is provided that incurs minimal extra area and power overhead.

According to another aspect of an embodiment of the invention, a calibration method is provided that avoids introducing extra components in the ADC critical path so as not to degrade overall performance.

According to yet another aspect of an embodiment of the invention, background calibration is employed in a manner that is transparent to normal sampling operations while tracking environmental variations such as temperature and power supply.

According to another aspect of an embodiment of the invention, the calibration method is deterministic and does not rely on the statistical characteristics of the input signal.

According to a further aspect of an embodiment the invention, a digital approach is provided to facilitate technology migration and integration.

According to certain embodiments of the invention, the subject calibration utilizes a redundant comparator and a finite state machine (FSM) that are not located along a critical signal path of a flash ADC.

In accordance with an embodiment of the invention, a redundant comparator is used to calibrate an existing comparator array of a flash ADC. The flash ADC can include an array of parallel repetitive blocks, also referred to as "comparators," and a reference "redundant comparator" for the calibration. The input of the redundant comparator is the same as the comparator array, and its reference voltage is reconfigurable according to the ADC comparator being calibrated. According to a specific embodiment, the reference voltage of the redundant comparator is made the same as that of the comparator of the selected ADC comparator.

According to certain embodiments of the invention, the components and circuitry for performing the background calibration for a flash ADC include: a first multiplexer (MUX), which allows the redundant comparator to select the reference voltage from those of the other comparators; a dedicated FSM, which coordinates the calibration process; a second MUX, which is used to select the comparator output being sent to the FSM for comparison with the output of the redundant comparator; and a memory, which can be used to store results of the comparison.

In one embodiment, to calibrate a particular comparator of the flash ADC, the FSM selects the comparator being calibrated such that it receives the output of that comparator and sets the reference voltage of the redundant comparator to the same as that of the comparator being calibrated. The FSM then compares the two outputs. Because the two comparators are connected to the same reference voltage and digitizing the same analog input, their outputs should ideally be the same. By looking at the discrepancies, polarity of the mismatch can be extracted and used for calibration. The FSM can accumulate the results of a predetermined number of comparisons of that comparator to improve noise immunity and uses only the sign of the accumulated results to update the content of the memory location related to that comparator in one step. The process can be repeated to calibrate all of the comparators.

BRIEF DESCRIPTION OF THE DRAWINGS

FIG. 10A shows the first two stages of the preamplifier and the DAC according to one embodiment; FIG. 10B shows the CMI, latches according to one embodiment; and FIG. 10C shows the SAFF according to one embodiment.

FIGS. 11A-11F show schematics of comparator offset tuning circuits that can be used in a comparator of an ADC according certain embodiments of the invention.

DETAILED DISCLOSURE

A circuit and method for background calibration of an ADC is provided that utilizes a redundant comparator and a FSM that are not located along a critical signal path of the ADC.

In accordance with an embodiment of the invention, a redundant comparator is used to calibrate an existing comparator array of a flash ADC. According to one embodiment, a single, reconfigurable redundant comparator can be used for all comparators of a flash ADC. Flash ADCs are currently the preferred architecture for converting RF and microwave analog signals to digital due to their ability to perform the conversion at those high frequencies. Flash ADCs are also suitable for handling large bandwidths, and therefore, are often used for data acquisition, satellite communication, radar processing, oscilloscopes, and high-density disk drives. Accordingly, embodiments of the invention can be implemented for a variety of applications. In addition to flash ADCs, embodiments of the invention can be applied to multi-channel ADCs where multiple sub-ADCs work in parallel on a signal channel. The subject calibration circuits and methods can be applied to maintain consistency between the parallel sub-ADCs. In another embodiment, the subject calibration circuits and methods can be used to align the delay of multiple signal chains, such as parallel buffer chains for a parallel data bus.

Figure 1A:
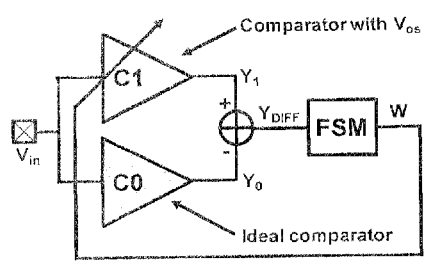
FIGS. 1A and 1B show a block diagram and corresponding waveforms, respectively, for calibrating a single comparator in accordance with an embodiment of the invention.
Figure 1B:
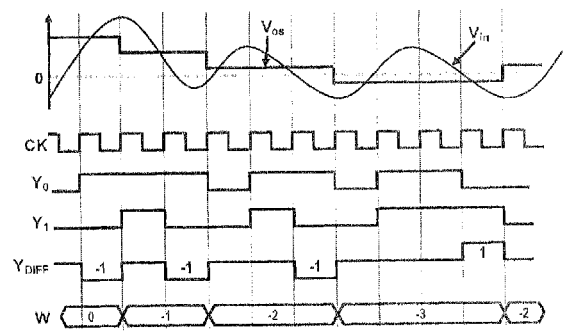

In accordance with an embodiment of the invention, a digital background calibration scheme is performed to calibrate an ADC. FIGS. 1A and 1B illustrate the calibration of a single comparator in accordance with an embodiment of the invention. Referring to FIG. 1A, a comparator (C1) is calibrated with the aid of a reference comparator (C0) working in parallel to sample an input Vin. For ease of understanding, the reference comparator (C0) is shown as an ideal comparator. FIG. 1B shows the corresponding sample timing diagram. The outputs Y1 and Y0 of the two comparators are compared and the difference analyzed by a FSM, which then provides an output W used to calibrate the comparator (C1). When the sampled input hits between the thresholds of C0 and C1, a discrepancy in their outputs occurs and the FSM calibrates C1 accordingly. By the end of the calibration, the offset of C1 will dither around zero with a maximum error of one calibration step.

Figure 2:
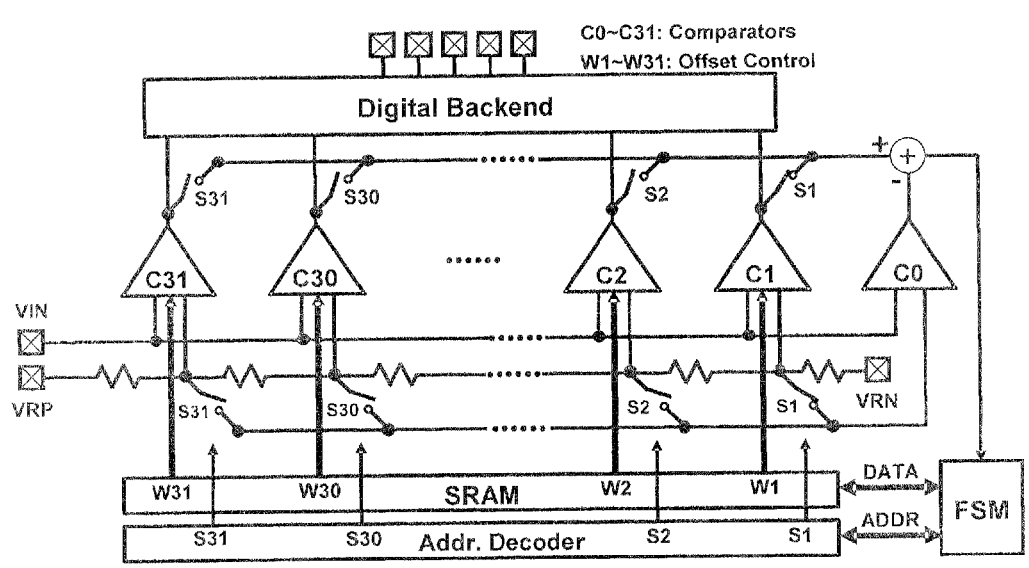
FIG. 2 shows a block diagram of an ADC according to an embodiment of the invention.

This calibration scheme is applied to each comparator of a comparator array in the ADC. For example, FIG. 2 shows a diagram of a 5-bit ADC with background calibration in accordance with an embodiment of the invention. Of course, it should be understood that embodiments of the invention can be applied to any N-bit ADC where N is the number of bits output by the ADC. As shown in FIG. 2, an array of comparators C1~C31 digitize the analog input against 31 reference voltages generated by a resistor ladder. A single reference comparator C0 is provided as the redundant comparator. Each comparator has an SRAM whose content controls a current steering DAC to cancel the comparator's offset. In accordance with an embodiment of the invention, the reference voltage of the redundant comparator is selectable from the resistor ladder through a MUX controlled by switch signals S1—S31. The outputs of C1~C31 are also selectable through a MUX. A FSM coordinates the calibration process.

In accordance with an embodiment of the subject calibration scheme, to calibrate C1, the FSM sets ADDR to 1. This sets S1 to HIGH, so that C0 and C1 are connected to the same reference voltage. Meanwhile, the output of C1 is also selected, as illustrated in FIG. 2. The FSM then compares the outputs of C0 and C1, and calibrates C1 based on any discrepancies that occur. After C1 is calibrated, the FSM sets ADDR to 2 and calibrates C2. This process is repeated cyclically for C1~C31 so that they are all calibrated in the background. By performing this process, the calibrated offsets of C1~C31 converge to that of C0, with a maximum error of only one calibration step.

Although C0 is described as an ideal comparator without offset, such an ideal comparator may not be available in actual implementations. If C0 contains an offset, this offset will be copied to C1~C31 during the calibration scheme, resulting in a DC offset in the ADC's transfer curve. For applications where such a DC offset may not be tolerable, C0 can be calibrated before being used as a golden reference for C1~C31.

According to one embodiment for calibrating C0, since C0 is redundant, C0 can be disconnected from the input and calibrated with any suitable foreground calibration technique. In another embodiment, the mean of the offset control codes W1-W31 can be computed after the calibration settles and then used as the offset control word for C0, which effectively averages the offsets of C1~C31.

Figure 9:
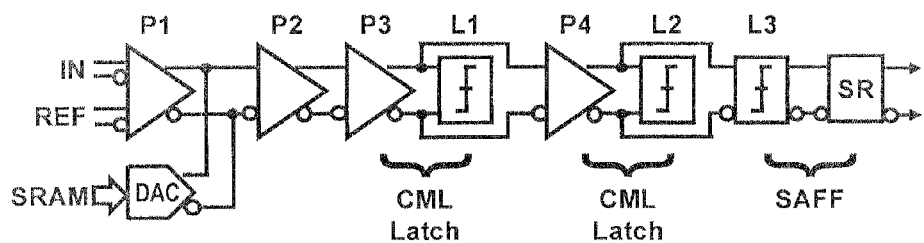
FIG. 9 shows a simplified schematic of a comparator of an ADC according to an embodiment of the invention.
Figure 11D:
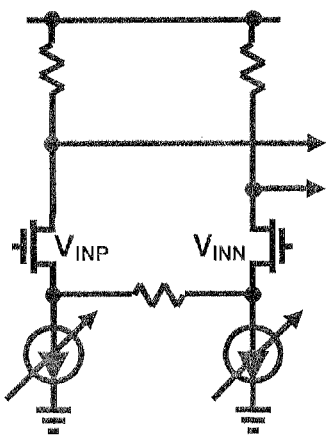
Figure 11E:
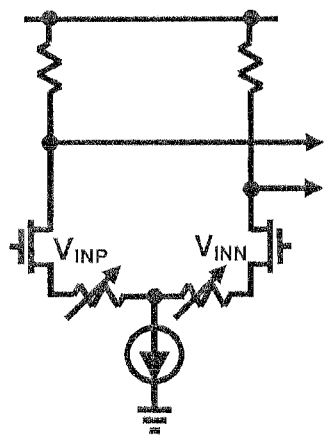
Figure 11F:
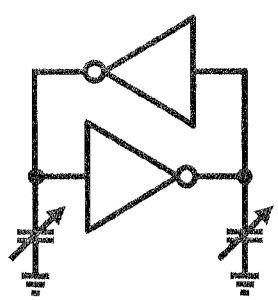

A flash ADC according to one embodiment of the invention includes an array of comparators and a reference redundant comparator for the calibration, where each comparator includes a comparator (such as shown in FIG. 2). The comparator for each comparator can be implemented in a variety of ways. For example, the comparator can be a cascade of wideband low-gain stages. In certain embodiments, each comparator includes 2-3 preamp stages, multistage latches, and an offset control. In a specific embodiment, each comparator can include a preamp, offset control, and two latches. The preamp can include two stages—a first preanip stage and a second preamp stage. The second pre-amp stage can be used for increased bandwidth. In addition, when the latches are current-mode logic (CML) D-latches, such as shown in FIG. 9, a sense-amplifier-based flip-flop can be included to convert CML levels to full swing. The offset control can be an N-bit current steering DAC that accepts a control word from a SRAM and injects static current to the output of the first preamp stage to cancel the offset of the comparator. In one embodiment, the N-bit current steering DAC is a 5-bit current steering DAC. Comparator offset tuning circuits that can be used in comparators of the ADC according to certain embodiments of the invention include, but are not limited to, the tuning circuits shown FIGS. 11A-11F. For example, FIG. 11A shows a circuit with current injection to the output, FIG. 11B shows an unbalanced transistor tuning circuit, FIG. 11C shows a circuit that combines the outputs of the two comparators with opposite offsets, FIG. 11D shows a circuit having current injection to degeneration resistor, FIG. 11E shows an unbalanced degeneration tuning circuit, and FIG. 11F shows an unbalanced capacitor tuning circuit.

According to an embodiment of the invention, the input of the redundant comparator is the same as the comparator array, and its reference voltage is reconfigurable according to the ADC comparator being calibrated. According to a specific embodiment, the reference voltage of the redundant comparator is made the same as that of the comparator of the selected ADC comparator.

According to certain embodiments of the invention, the components and circuitry for performing the background calibration for the flash ADC having the array of comparator comparators and reference redundant comparator include: a first MUX, a dedicated FSM, a second MUX, and a memory. The first MUX allows the redundant comparator to select the reference voltage from those of the other comparators. The second MUX is used to select the comparator output being sent to the FSM for comparison with the output of the redundant comparator. The memory is used to store offset control values, which can be updated based on the results of the comparison. According to an embodiment of the invention, a sign/polarity of the comparison results accumulated by the FSM is used to determine whether the offset control values stored in the memory are updated. In certain embodiments, the memory is SRAM. In one embodiment, a portion of existing SRAM or other memory of the analog front-end is used for the memory.

In another embodiment, the FSM or a memory storing the results of the comparison can provide, via routing, the results of the comparison to any component on-chip or off-chip (e.g., a stand-alone calibration engine). For applications where the delay of multiple sub-systems is being calibrated, layout of the circuit and signal lines would take into consideration the routing latency.

The FSM is used to coordinate the calibration process and includes a block of combinational logic to determine state transition and a block of combinational logic to determine the output of the FSM. The FSM can also include internal memory, referred to as registers. The FSM can be provided via a programmable logic device, a programmable logic controller, logic gates and flip-flops or relays.

Figure 3:
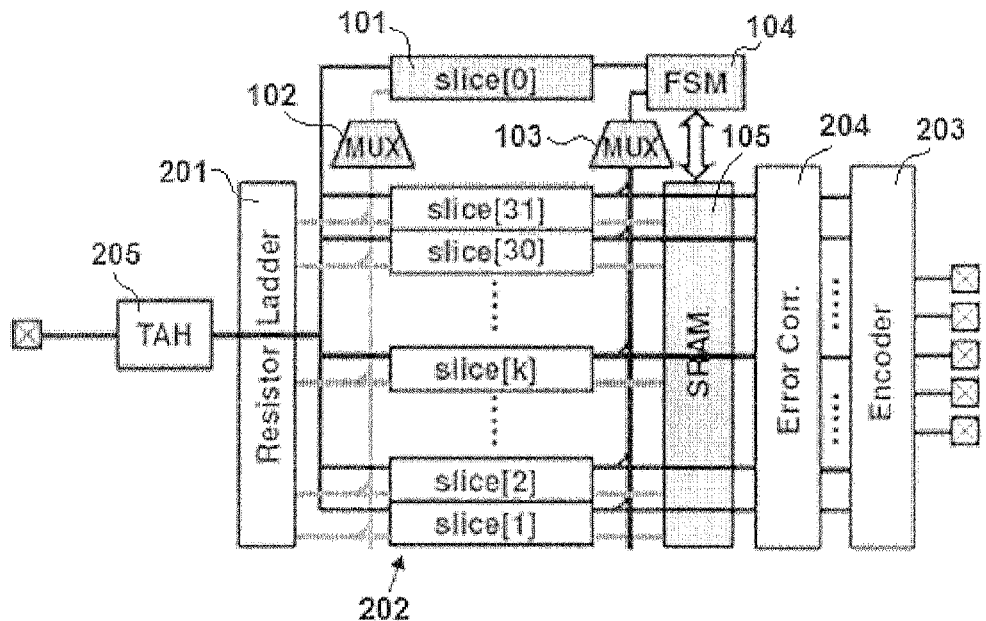
FIG. 3 shows a block diagram of an ADC according to an embodiment of the invention.

FIG. 3 shows a block diagram of a 5-bit ADC (N=5) in accordance with an embodiment of the invention. Referring to FIG. 1, the calibration portion of the device includes a reference comparator 101, two MUXs 102 and 103, a FSM 104, and a memory 105.

The ADC portion of the device includes a resistor ladder 201 for providing resistor-divided reference voltages for each comparator, $2^5-1=31$ comparator comparators 202, and an encoder 203. A clock is also used for the sampling and other elements of the ADC. The reference voltage for each comparator is at least one least-significant-bit (LSB) higher than the reference voltage for the comparator immediately below it. In one embodiment, the encoder can be implemented as combinational logic. In another embodiment, the encoder is implemented as a ROM encoder. Of course, other encoders may be used.

A bubble error correction circuit 204 can also be included (separately or as part of the encoder) to address output errors occurring due to "bubbles" or "sparkle" in thermometer code output by the comparators. In particular, bubble error correction can inhibit a comparator that has tripped low (binary '0') from outputting a low code if it is surrounded by comparators that have tripped high (binary '1') and may also inhibit a comparator that has tripped high (binary '1') from outputting a high code if it is surrounded by comparators that have not tripped high (binary '0').

A passive track-and-hold (T/H) 205 can be included in the analog front end to reduce errors due to skew in signal arrival time to the comparators while providing sufficient linearity. T/H circuits typically include a buffer amplifier, an electronic switch, and a signal storing device, such as a capacitor. In certain embodiments, the T/H can be provided as part of each comparator.

In a further embodiment, a down-sampler (not shown) can be included to convert the digital signal frequency provided by the ADC to a frequency within a range acceptable to subsequent processing circuits.

Although a 5-bit flash ADC is described herein, embodiments are not limited thereto. For example, 4-bit to 8-bit flash ADCs can be implemented with the subject calibration circuit. In addition, the subject calibration circuits can be adopted for other ADC architectures having a plurality of comparators.

In one embodiment, to calibrate a particular comparator of a flash ADC, the FSM selects the comparator being calibrated such that it receives the output of that comparator and sets the reference voltage of the comparator being calibrated as the reference voltage to the redundant comparator. The FSM controls the first MUX to select the particular reference voltage for the redundant comparator and controls the second MUX in order to receive an output of the selected comparator. The FSM then compares the two outputs (the output from the selected comparator and the output from the redundant comparator). Because the two comparators are connected to the same reference voltage and digitizing the same analog input, their outputs should ideally be the same. By looking at the discrepancies, polarity of the mismatch can be extracted and used for calibration. In accordance with an embodiment of the invention, the FSM accumulates the results of a predetermined number of comparisons of that comparator and uses only the sign of the accumulated results to update the content of the memory location related to that comparator in one step. The process can be repeated to calibrate all of the comparators/comparators.

Figure 4:
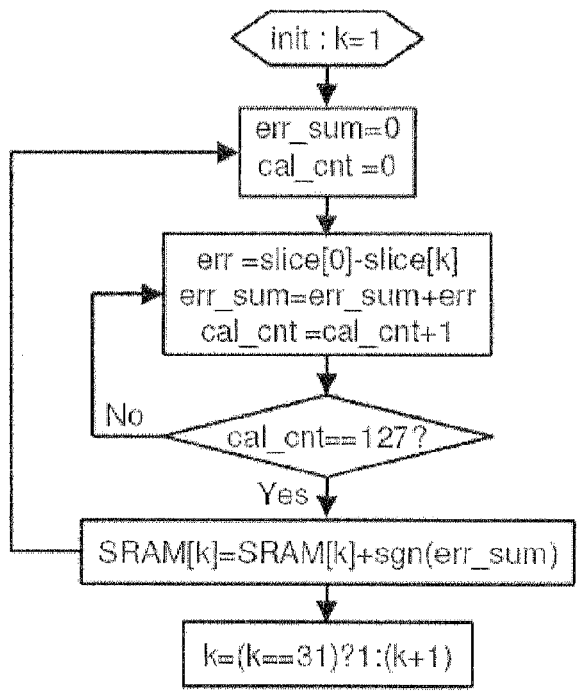
FIG. 4 shows a flow chart of a calibration method according to an embodiment of the invention.

FIG. 4 illustrates a flow chart of one embodiment of the subject calibration scheme. Referring to FIG. 4, the calibration can be initialized by setting k=1 in the FSM and setting err_sum=0 (the summation of the errors) and cal_cnt=0 (the counter). That is, the FSM selects first comparator (comparator[1]), as well as VRET[1] (the reference voltage for the first comparator). Then, the FSM compares the outputs of comparator[1] and the redundant comparator comparator[0] by performing the comparison err=comparator[0]-comparator[k] and adding the error err to the err_sum. The counter cal_cnt is increased by 1, and the comparison is performed for a predetermined number of times. In the example shown in FIG. 4, the comparison of each comparator is performed 128 times. The predetermined number of comparisons can be selected by considering the processing speed and desired noise immunity. In addition, the predetermined number of comparisons can be the same for each comparator or can be different for one or more of the comparators depending on the particular implementation. In certain implementations, the predetermined number of comparisons can change for the comparators over time or may be a constant number of comparisons. The number of comparisons determines how fast the calibration algorithm runs. A higher number of comparisons results in a greater immunity to errors caused by noise, but slower processing speed.

The corresponding polarity (sign) of the mismatch is extracted as sgn(err_sum). After performing the comparison, the memory location SRAM[1] is updated according to the sign of the accumulated results. For example, if sgn(err_sum)=+1, the word stored at memory location SRAM[1] is incremented. If sgn(err_sum)=-1, the word stored at memory location SRAM[1] is decremented.

The process of calibration is repeated by adding 1 to k (until k equals the total number of comparators) and setting err_sum=0 and cal_cnt=0 before performing the comparison of that next comparator (k+1). By performing this method, the calibrated offsets of the comparators converge to that of the reference comparator, with an error of only one calibration step. Accordingly, the above described calibration method runs entirely in the digital domain, without additional analog blocks.

Because offset changes slowly over time, the FSM is clocked at low speeds ($\frac{1}{128}$ of the sampling clock in the example implementation). The FSM and the reference comparator can be shut down completely when calibration is not needed, so that the calibration scheme's power overhead is negligible. In addition, because the reference comparator is not used in the actual digitizing process, the reference comparator can be calibrated using any foreground calibration technique. The reference comparator can then serve as a golden reference. Since the reference comparator can be calibrated in the foreground, the calibration converges to zero, instead of the average offset of selected devices. Further, even if the reference comparator is not calibrated, the subject calibration method is merely impacted with respect to the ADC's offset. The INL and DNL can still be effectively calibrated.

Advantageously, the subject calibration method does not necessitate any change in the critical signal path. In addition, the subject calibration method does not rely on any special characteristics of the input signal. Rather, it is assumed that the input signal transverses the trip points of all comparators statistically, which is valid for most applications.

The subject calibration method can provide a self-healing ADC by facilitating calibration during ADC operation with minimal adverse effects. In accordance with various embodiments of the invention, calibration circuitry and methods are provided that incur minimal area and power overhead, avoid introducing extra components in the ADC critical path, employ background calibration that is transparent to normal sampling operations while tracking environmental variations such as temperature, and/or are deterministic. An all-digital calibration approach is also provided, facilitating technology migration and integration.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Example

5-Bit ADC with Background Calibration

Figure 5:
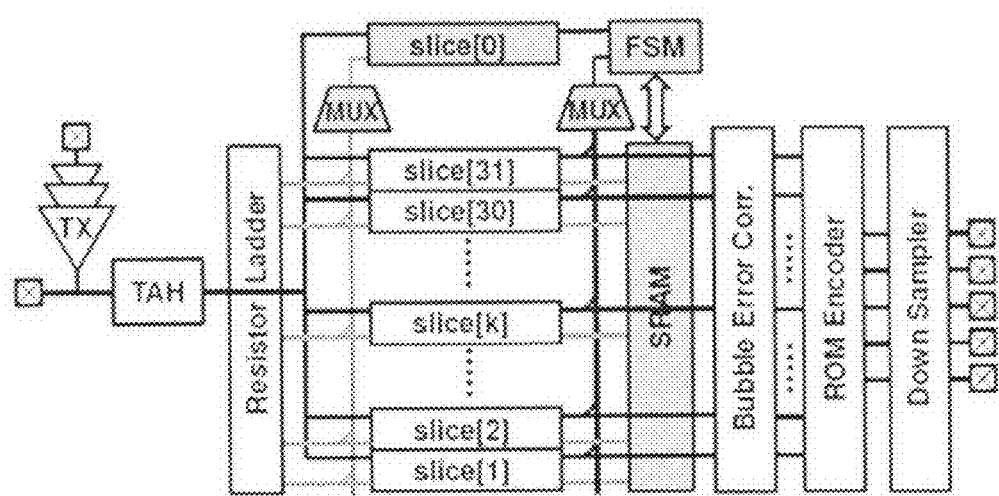
FIG. 5 shows a block diagram of an ADC with test set-up according to an example embodiment of the invention
Figure 6:
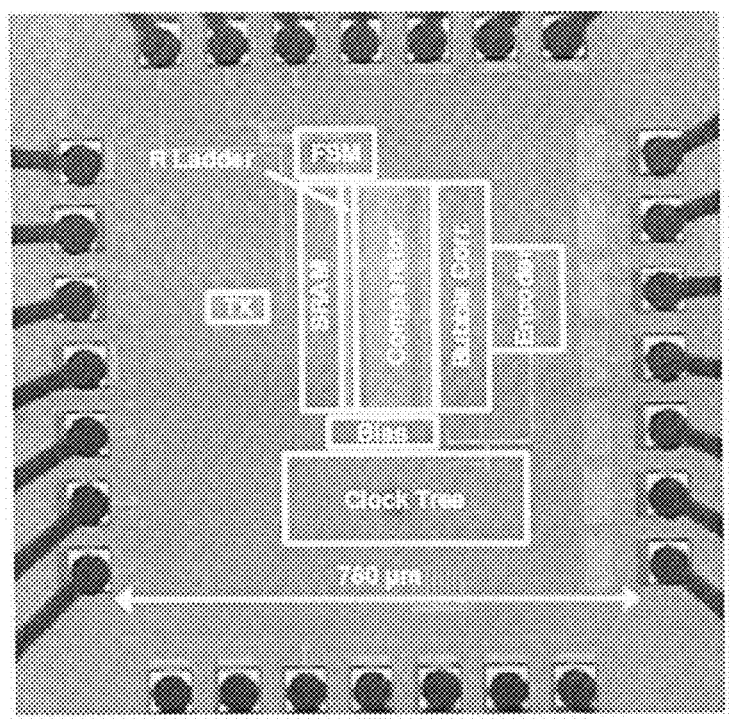
FIG. 6 shows a die micrograph of an ADC according to an embodiment of the invention.

A self-healing 5-bit ADC according to an embodiment of the invention was designed as shown in the simplified schematic of FIG. 5. A test chip was implemented in 0.13 µm hulk CMOS and mounted on a QFN package. FIG. 6 shows the die micrograph. The ADC occupies an active area of 0.24 mm$^2$, of which only 2.5% is taken by the FSM and 7% by the SRAM.

Figure 7:
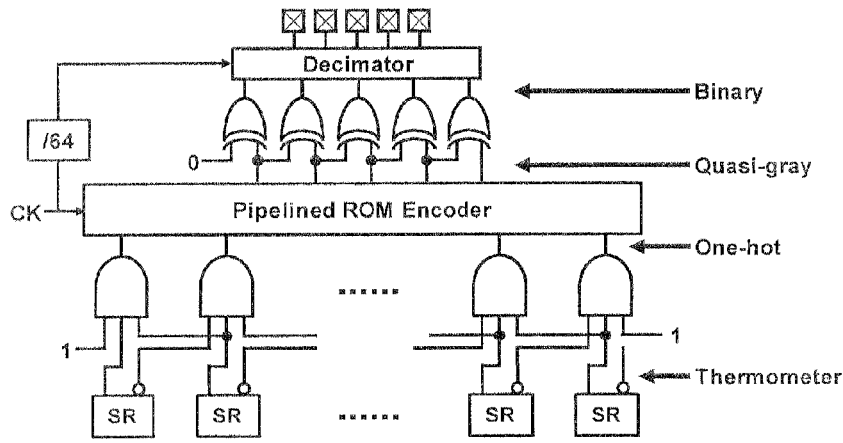
FIG. 7 shows a block diagram of a digital backend of an ADC according to an embodiment of invention.

As shown in the schematic of FIG. 5, 31 comparators (comparator[1:31]) are used for digitizing an input signal and an additional reference comparator (comparator[0]) is employed for the calibration. In the schematic, single-ended signaling is shown for simplicity; however, actual implementation is differential. The 31 comparators digitize the sampled signal against 31 evenly spaced reference voltages VREF[1:31] generated by a resistor ladder and produce a 31-bit thermometer code. The thermometer code is then converted to binary format by the digital backend. For example, the thermometer code first goes through a bubble error corrector before being converted to binary word using a ROM encoder. FIG. 7 shows a block diagram of a digital backend providing the bubble error correction, ROM encoder, and down sampler shown in FIG. 5. Referring to FIG. 7, the digital backend converts the output thermometer codes of the comparator/comparator array to binary format. It also provides the capability of correcting or minimizing errors due to bubbles or metastabilities. The three-input NAND gate array converts the thermometer codes to one-hot codes and provides first order bubble error correction. The one-hot codes are then used to address a quasi-gray-code ROM encoder. Simple XOR gates convert the quasi-gray code to binary codes. For the example embodiment, the full-speed binary code is then decimated by 64 (down-sampled) to accommodate the limited bandwidth of the test equipment. The resistor ladder for the fabricated chip consists of identical poly resistors with W/L of 8 µm/4 µm. With proper layout the mismatch between the unit resistors is estimated at ~1% (in certain estimates the mismatch was estimated at <0.35%), and is therefore negligible in comparison to transistor mismatches. To stabilize the reference voltages and suppress input feedthrough, decoupling PMOS capacitors are connected to all resistor ladder output taps. The power consumption of the resistor ladder is 0.21 mW.

Figure 8:
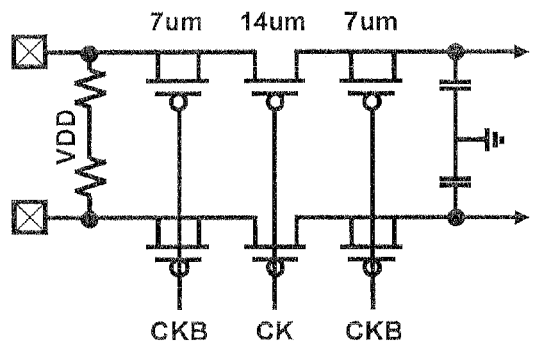
FIG. 8 shows a schematic of a T/H circuit of an ADC according to an embodiment of the invention.

A passive T/H is included in this example embodiment to reduce errors due to skew in signal arrival time to the comparators while providing sufficient linearity. The T/H helps minimize linearity degradation due to signal dependent comparator delays and the clock and signal skew between comparators. For the example implementation, since the input voltage swing is from $V_{DD}-0.4V$ to $V_{DD}$, PMOS transistors are used as shown in FIG. 8, avoiding a buffer to shift the input common mode level. To cancel charge injection, which can limit the T/H linearity, dummy switches driven by a delayed complementary clock are used at both sides of the sampling switch. It should be understood that the T/H can be implemented by any suitable circuit known in the art and may even be omitted.

For the test set-up, an integrated transmitter (TX) is included in the chip to enable the ADC to also be configured as a time domain reflectometer (TDR). During normal ADC operation, the TX is disabled in order to present proper termination for the ADC. When the transmitter is enabled, pulses with sharp edges are launched into the channel and the ADC records the reflected waveforms to derive the channel characteristics.

Clock distribution can be very important in high speed ADC design. For the example chip design, the clock buffers are sized for the same fan-out. In addition, dummy loads are inserted in the clock tree to compensate for unbalanced loads. To account for the finite delay through the preamp of a comparator, the clock of the T/H leads the rest of the comparators (e.g., comparators) by one inverter delay. Since the clock of the FSM and the decimator (down sampler) is divided down from the full-speed clock and its phase in relation with the full-speed clock is unknown, multiple phases are generated for selection through an on-chip serial interface.

Separate power planes are distributed to the corresponding analog and digital domains, and each are provided with dedicated decoupling capacitor banks. To inhibit noise coupling through the substrate, guard rings are inserted between the analog and the digital domains with dedicated ground connections. The ground pads for the guard rings are separate from the analog and digital ground pads.

The reference comparator is identical to the other 31 comparators except that its reference voltage is selectable from VREF[1:31] through a MUX. The outputs of the comparator [1:31] are also selectable through a MUX. According to an embodiment of the invention, the MUX provides a signal to a switch. The switches for calibration can be simple CMOS transmission gates. For the example embodiment, the FSM is implemented in hardware description language and then synthesized with software tools out of standard cells. Advantageously, the calibration is fully digital. The calibration circuitry is clocked at 1/64 of the sampling clock. To improve noise immunity, the FSM accumulates the results of 128 comparisons and uses only the sign of the accumulated results to update the content of the SRAM. Although 128 comparisons degrades the calibration convergence speed, such degradation can be easily tuned due to its digital nature.

FIG. 9 shows a simplified block diagram and schematic of a comparator used in the ADC of the present example. As shown in FIG. 9, each comparator has two preamps followed by two current-mode logic (CML) latches (with corresponding preamplifier stage) and a sense-amplifier-based flip-flop (SAFF) to convert CML levels to full swing. In particular, a three-stage preamplifier P1, P2, and P3, followed by a regenerative latch L1 digitizes the difference between input and reference voltages. Another two latch stages L2 and L3 reduce metastability and convert current-mode-logic (CML) levels to full swing CMOS logic levels. A current steering DAC accepts the control word from the SRAM and injects static current to the output of the first preamplifier stage to cancel the offset of the whole comparator. In the example embodiment, the SRAM and current steering DAC use 5-bits.

The preamp amplifies the difference between the differential sampled signal ($V_{INP}-V_{INN}$) and the reference voltage ($V_{REFP}-V_{REFN}$) to larger voltage swings for the CML latch to digitize, resulting in faster regeneration. It also helps suppress charge kickback from the following latch stage. Although not used in the example implementation, dynamic comparators may be used without preamplifiers to minimize static current consumption. Such embodiments would take into consideration the power supply and common-mode rejection constraints.

Figure 10A:
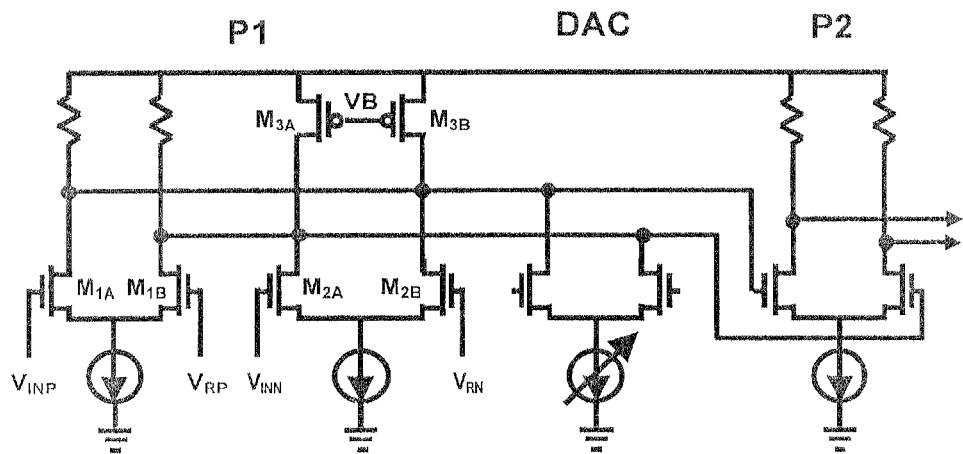
FIGS. 10A-10C show schematics of elements of the comparator of the ADC shown in FIG. 9 in accordance with certain embodiments of the invention.

One important design consideration for the preamp is the overdrive recovery time, which is optimized by a large gain bandwidth product (GBW). Two cascaded preamp stages P1 and P2 are used to maximize GBW in this design. FIG. 10A shows the schematics of P1, P2 and the DAC used for the example implementation. Although not used in the example design, the DAC can be implemented using any suitable comparator offset tuning circuits such one of those shown in FIGS. 11A-11F. Throughout this design, resistor loads are used instead of diode connected transistors. Two transistors biased in the saturation region ($M_{3A}$ and $M_{3B}$) are used to bypass half of the current to reduce the voltage headroom on $R_{1A}$ and $R_{1B}$ by half. Since the second preamp stage P2 has less self loading, it can achieve a larger GBW than the first stage given the same bias condition and fan-out. The gain of the second stage was therefore designed to be about 70% higher than the first stage, while the bandwidths of the two stages were designed the same. Simulation shows that this technique achieves a 25% higher GBW than a single stage preamp given the same power budget. No inductive peaking is used to save area.

Figure 10B:
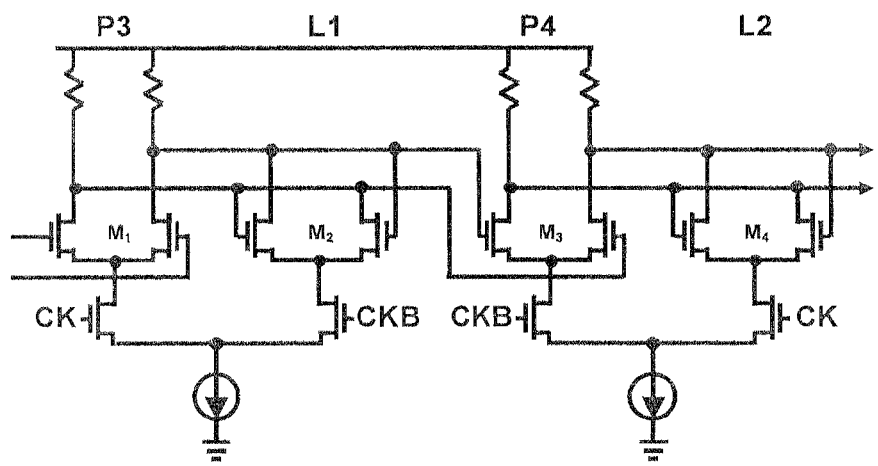

The third preamp stage P3 is merged with L1 into a CML latch, the schematic of which is shown in FIG. 10B. When CK is high, P3 is enabled and builds a voltage difference at its output. When CK goes low, L1 amplifies the voltage difference regeneratively until the output saturates. Also shown in FIG. 10B are the schematics of P4 and L2, which are identical to P3 and L1 except that their clocks are inversed to form a CML flip-flop.

Figure 10C:
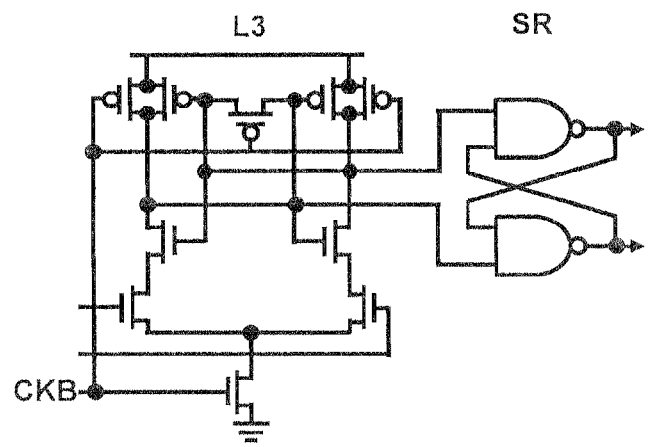

The last two stages of the comparator are a sense-amplifier (SA) and a set-reset (SR) latch, forming a sense-amplifier flip-flop (SAFE) to suppress metastability errors with additional gain and convert CML level to full-swing CMOS level. FIG. 10C shows their schematics. The core of the SA has two cross-coupled inverters. When CKB is low, the SA is reset with both output nodes pulled to VDD. At the rising edge of CKB, the cross-coupled inverters are released to amplify the voltage difference between the two inputs with positive feedback to full swing. The SR latch stores the amplification result for a whole clock cycle.

Since the offset of later stages are suppressed by the preamp gain, the comparator offset is dominated by the preamp. To minimize power consumption and area, the transistors in the preamps are sized close to minimum. Monte Carlo simulation with 100 runs indicates the comparator has a 3σ offset of ±3.06 LSB, 90% of which (±2.73 LSB) is contributed by the preamp. Based on these simulations, an ADC without calibration would have needed 37 times larger transistor sizes, even if a very relaxed design goal of ±0.5 LSB is assumed.

As explained with reference to FIG. 4, to calibrate comparator[k], the FSM selects VREF[k] as the reference voltage to comparator[0]. The FSM then compares the outputs of comparator[0] and comparator[k]. By looking at the discrepancies between comparator[0] and comparator[k], the corresponding polarity of the mismatch can be extracted and used for calibration. To improve noise immunity, the FSM accumulates the results of 128 comparisons and uses only the sign of the accumulated results to update the content of the SRAM

[k] by one step. This process is repeated continuously until the offsets of all the comparators are calibrated. In the end, the calibrated offsets of comparator[1:31] converge to that of the reference comparator, with an error of only one calibration step.

Figure 12A:
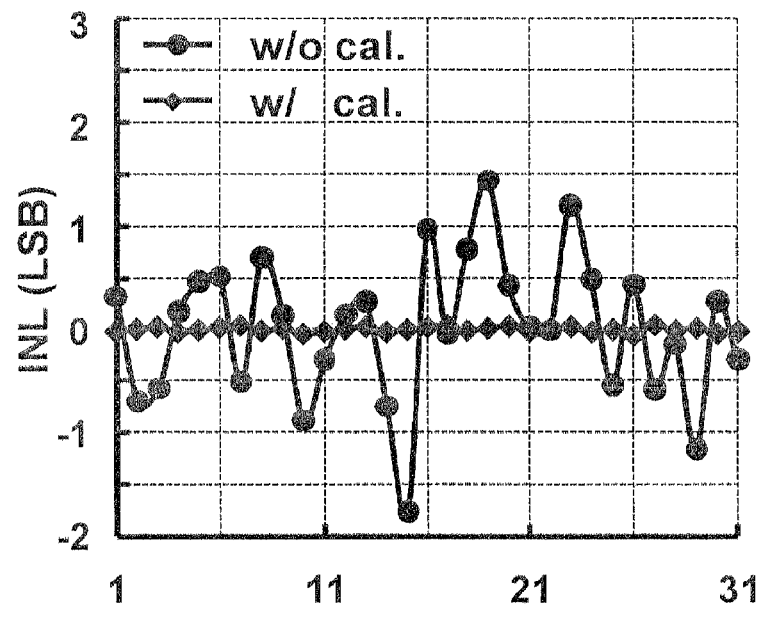
FIG. 12A shows a comparison of measured integral non-linearity (INL) for an ADC with calibration in accordance with an embodiment of the invention and an ADC without calibration.
Figure 12B:
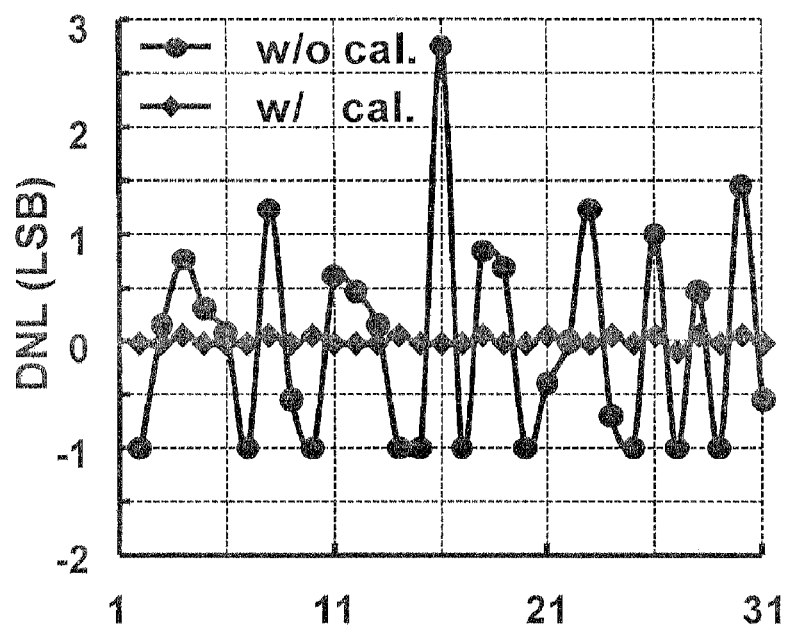
FIG. 12B shows a comparison of measured differential nonlinearity (DNL) for an ADC with calibration in accordance with an embodiment of the invention and an ADC without calibration.

The ADC DC performance was first evaluated by applying DC voltages at the input and recording the output codes. FIG. 12A shows a comparison of measured INL for an ADC with calibration in accordance with an embodiment of the invention and an ADC without calibration, and FIG. 12B shows a comparison of measured DNL for an ADC with calibration in accordance with an embodiment of the invention and an ADC without calibration. DNL indicates how much a code width deviates from the ideal value of 1 LSB. The INL indicates the maximum deviation of the actual ADC transfer function from a straight line drawn through the first and last code transitions and is also defined by the accumulation of DNL errors over the complete ADC characteristic.

As shown in FIGS. 12A and 12B, when calibration is disabled, i.e., all the SRAM contents are cleared to 0, the ADC has an INL and DNL of 1.77 LSB and 2.75 LSB, respectively. Enabling calibration significantly improves the INL and DNL to 0.06 LSB and 0.05 LSB, respectively.

Figure 13A:
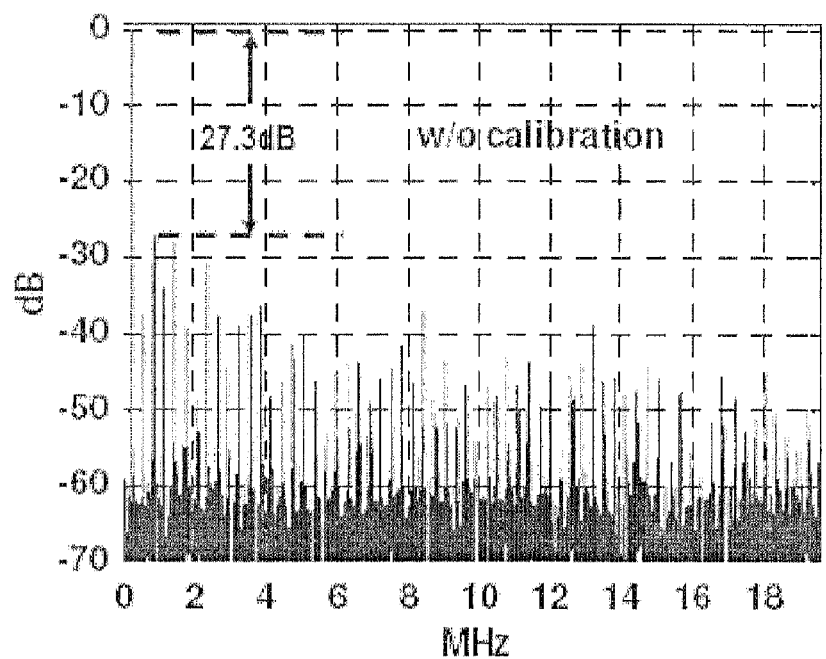
FIG. 13A shows an output spectrum of an ADC without calibration.
Figure 13B:
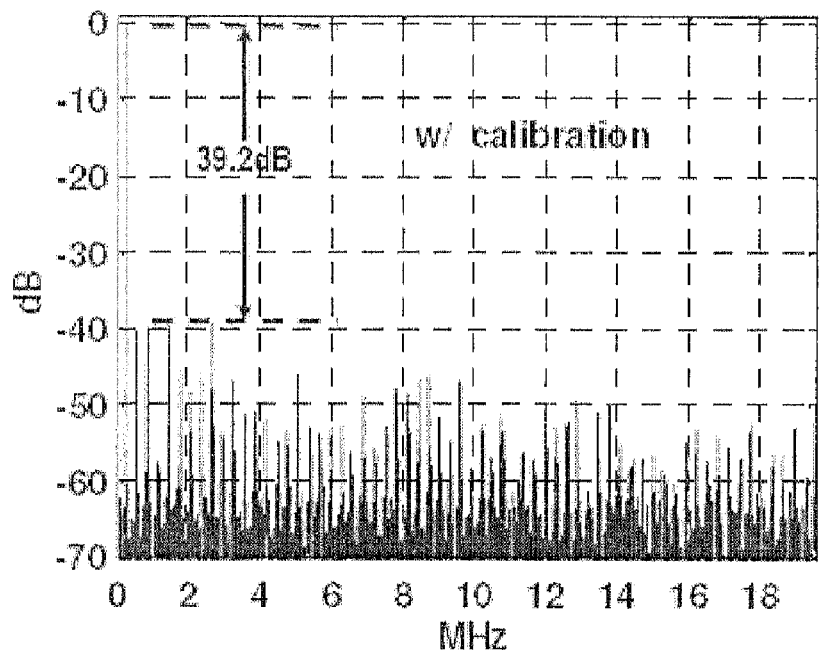
FIG. 13B shows an output spectrum of an ADC with calibration in accordance with an embodiment of the invention.
Figure 14:
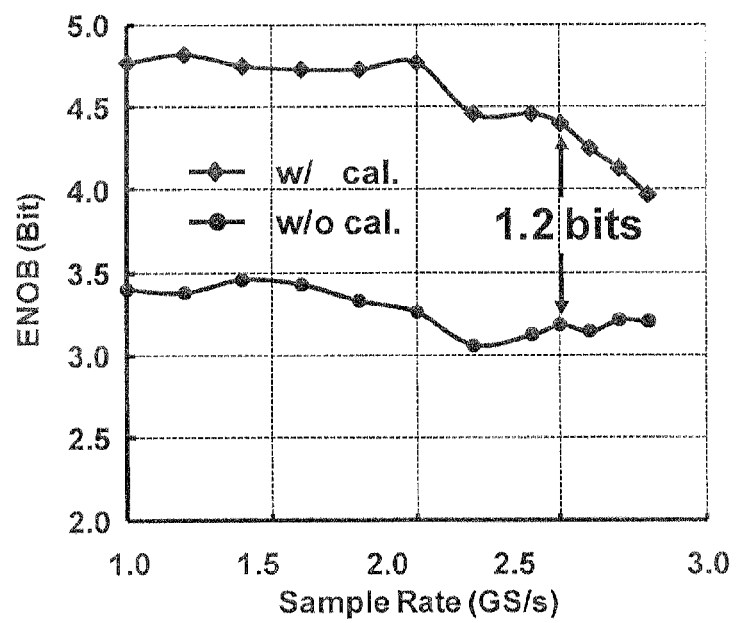
FIG. 14 shows a comparison of effective numbers of bits (ENOB) for an ADC with calibration in accordance with an embodiment of the invention and an ADC without calibration.

The decimated (down sampled) digital output of the ADC was captured by a mixed-signal oscilloscope and post-processed in Matlab. FIG. 13A shows an output spectrum of the ADS without calibration, and FIG. 13B shows an output spectrum of the ADS with calibration according to an embodiment of the invention. The output of the ADS is a full-scale 1.172 GHz sine wave and the sample rate is 2.5 GS/s. Due to decimation, the fundamental tone is aliased to 0.3 MHz and the frequency spans from DC to 19.53125 MHz instead of from DC to 1.25 GHz. The spurious free dynamic range (SFDR) improves by nearly 12 dB from 27.3 dB to 39.2 dB. The corresponding ENOB improvement is therefore 1.22-bit, from 3.18 to 4.40. FIG. 13 shows the comparison of the measured ENOB at various sample rates with the input frequency kept around 1.20 Hz. Without calibration, the highest ENOB is below 3.5-bit. With calibration, the ADC achieves an ENOB of ~4.7-bit below 2 GS/s and remains above 4.4-bit until 2.5 GS/s. As shown in FIG. 14, for all sample rates, calibration improves the ADC ENOB by at least 1.2 bits.

Figure 15:
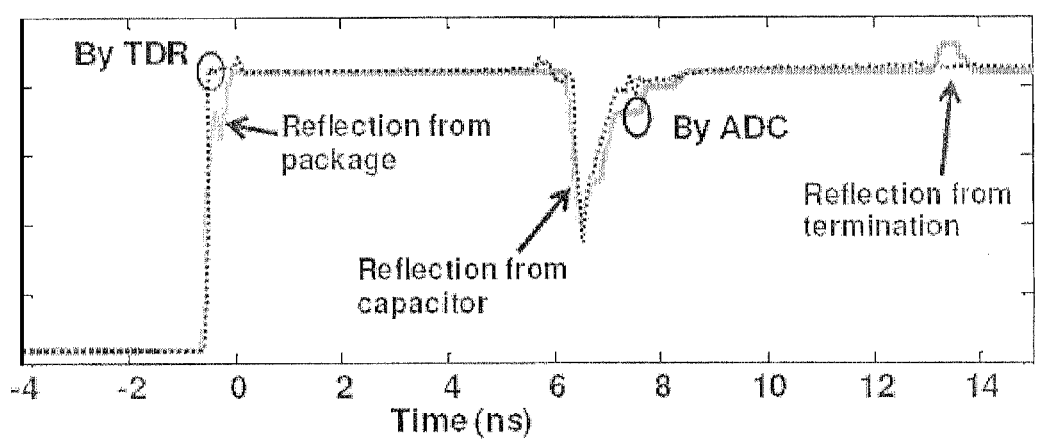
FIG. 15 shows time domain reflectometry measurements using a commercial system and an ADC-based time domain reflectometer (TDR) system using an ADC in accordance with an embodiment of the invention.

The on-chip transmitter (TX) allows the ADC to be configured as a TDR for in-situ characterization of chip/package/board interfaces and transmission lines for high-speed serial links. TDR functionality was verified by enabling the transmitter (TX). The 2.5 GS/s maximum sample rate of the ADC limits the timing resolution of the TDR to about 0.4 ns. To capture discontinuities of small electrical lengths along the channel, a higher timing resolution is used. This is achieved by driving the TX and ADC with a clock signal that is slightly offset in frequency, similar to an equivalent-time sampling oscilloscope. For example, by setting the TX clock to $f_o$ and the ADC clock to $f_o + \Delta f$, the effective timing resolution is set to $(1/f_o)(\Delta f/f_o)$. A 25 inch cable, an 11 pF capacitor to ground, and a terminated 6 inch PCB trace was used as the test channel. FIG. 15 shows TDR measurements using a commercial system and the disclosed in-situ ADC based TDR system (overlaid for comparison). At the rising edge, the ADC-captured waveform shows a small dip, which is caused by the reflection from the package. Both waveforms show a major dip caused by the capacitor, but the on-chip TDR shows an additional minor peak at twice the time delay from the initial rising edge. This may be due to an on-chip termination that is higher than 50Ω, resulting in multiple reflections. The on-chip TDR is able to resolve small discontinuities within the chip/package/board interface otherwise not possible to view without direct access with TDR test equipment.

The ADC core (excluding peripheral IO and termination) consumes 50 mW from a 1.2V supply.

Table 1 shows a performance summary of the ADC of the example embodiment in relation to the calibrated ADCs described in M. Kijima et al., "A 6b 3 GS/s Flash ADC with Background Calibration," CICC, 2009 (referred to as "Kijima"); Y. Nakajima et al., "A background self-calibrated 6b 2.7 GS/s ADC with cascade-calibrated folding-interpolating architecture," IEEE J. Solid State Circuits, pp. 707-718, April 2010 (referred to as "Nakajima"); S. Park et al., "A 3.5 GS/s 5-b Flash ADC in 90 nm CMOS," CICC, 2006 (referred to as "Park"); and H. Chen et al., "A 1-GS/s 6-bit two-channel two-step ADC in 0.13-µm CMOS," IEEE J. Solid State Circuits, pp. 3051-3059, November 2009 (referred to as "Chen").

TABLE I

Performance Comparison

| | Kijima | Nakajima | Park | Chen | Example Embodiment |
|---|---|---|---|---|---|
| ADC Bit No. | 6 | 6 | 5 | 6 | 5 |
| Fs (GS/s) | 3 | 2.7 | 3.5 | 1 | 2.5 |
| INL | 0.2 | 0.73 | 0.89 | 0.3 | 0.06 |
| DNL | 0.2 | 0.53 | 0.93 | 0.28 | 0.05 |
| ENOB | 5.8 (with 10 MHz input) | 5.3 | 3.6 | 5.3 | 4.4 |
| Process Node | 90 nm | 90 nm | 90 nm | 0.13 µm | 0.13 µm |
| VDD (V) | 1.2 | 1 | 1.4/1.8 | 1.2 | 1.2 |
| Power (mW) | 90 | 50 | 227 | 49 | 50 |
| Calibration | Background | Background | Foreground | None | Background |
| Area (mm²) | 0.28 | 0.36 | 0.66 | 0.16 | 0.24 |
| FoM (pJ/Conv.) | 2.3 (limited by ERBW) | 0.47 | 5.35 | 1.24 | 0.95 |

All publications referred to or cited herein are incorporated by reference in their entirety, including all figures and tables, to the extent they are not inconsistent with the explicit teachings of this specification.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. An analog-to-digital converter (ADC), comprising,
   a plurality of parallel comparators configured to receive an analog input signal and an analog reference voltage and provide a signal to an encoder;
   a redundant comparator configured to receive the analog input signal and a selected reference voltage of the plurality of parallel comparators;
   a finite state machine (FSM);
   wherein the FSM receives an output of the redundant comparator and a selected output of the plurality of parallel comparators and updates contents of a memory according to results of a comparison of the output of the redundant comparator and the selected output of the plurality of parallel comparators performed by the FSM.

2. The ADC according to claim 1, wherein the FSM performs the comparison by selecting one comparator of the plurality of comparators and determining a mismatch between the one comparator of the plurality of comparators and the redundant comparator.

3. The ADC according to claim 2, wherein determining the mismatch is performed a predetermined number of times for the one comparator.

4. The ADC according to claim 1, wherein the memory is SRAM.

5. The ADC according to claim 4, wherein the SRAM stores control words for an offset control circuit for calibrating each comparator of the plurality of parallel comparators, wherein the FSM updates contents of the SRAM.

6. The ADC according to claim 1, further comprising:
   a first multiplexer (MUX) connected to receive each reference voltage of the plurality of parallel comparators and output the selected reference voltage to the redundant comparator; and
   a second MUX connected to receive each output of the plurality of parallel comparators and output the selected output of the plurality of parallel comparators to the FSM.

7. The ADC according to claim 6, wherein the FSM controls operation of the first MUX and the second MUX to discretely select each comparator of the plurality of parallel comparators.

8. The ADC according to claim 7, wherein, for each discretely selected comparator of the plurality of parallel comparators, the FSM:
   (a) sets an error sum variable to 0 and a counter variable to 0;
   (b) compares the selected output of the plurality of parallel comparators to the output of the redundant comparator by subtracting the selected output of the plurality of parallel comparators from the output of the redundant comparator;
   (c) adds a result of the subtracting of the selected output of the plurality of parallel comparators from the output of the redundant comparator to the error sum variable;
   (d) increases the counter variable by 1; and
   (e) repeats (b)-(d) until the counter variable is equal to a predetermined value; and
   (f) extracts a polarity of a final value of the error sum variable.

9. The ADC according to claim 8, wherein when the counter variable is equal to the predetermined value, the FSM controls operation of the first MUX and the second MUX to discretely select a next comparator of the plurality of parallel comparators and performs (a)-(e).

10. The ADC according to claim 8, wherein the FSM updates contents of the memory according to results of the comparison of the output of the redundant comparator and the selected output of the plurality of parallel comparators performed by the FSM by using the polarity of the final value of the error sum variable to determine how to update the memory.

11. The ADC according to claim 1, wherein each comparator of the plurality of parallel comparators comprising the comparator receiving the analog input signal and the reference voltage, and the redundant comparator configured to receive the analog input signal, comprises:
   a first preamp stage receiving the analog input signal and the reference voltage of the comparator,
   an offset control using a content of the memory to control offset of the comparator,
   a second preamp stage connected to the first preamp stage to receive outputs of the first preamp stage;
   a first latch connected to the second preamp stage to receive outputs of the second preamp stage, and
   a second latch connected to the first latch to receive outputs of the first atch.

12. The ADC according to claim 11, wherein the first latch and the second latch are current-mode logic (CML) D-latches, each comparator further comprising a sense-amplifier-based flip-flop receiving an output of the second latch to convert a CML level of the output of the second latch to full swing.

13. The ADC according to claim 11, wherein the offset control comprises an N-bit current steering digital-to-analog converter (DAC), wherein the N-bit current steering DAC receives a control word from the memory and injects static current to the outputs of the first preamp stage received by the second preamp stage.

14. The ADC according to claim 13, wherein the FSM updates contents of the memory by providing a signal indicating an update for the control word for the selected comparator.

15. A background calibration method for an analog-to-digital converter (ADC) comprising a plurality of parallel comparators digitizing an analog input signal, each comparator comprising a comparator connected to a corresponding reference voltage, the method comprising:
   selecting a reference voltage of one comparator of the plurality of parallel comparators as input to a redundant comparator, the redundant comparator being connected to receive the analog input signal and output a reference signal to a first input of a finite state machine (FSM);
   selecting an output of the one comparator of the plurality of parallel comparators to receive the output of the one comparator as a second input to the FSM;
   comparing the output of the one comparator and the reference signal of the redundant comparator using the FSM;
   using a result of the comparing of the output of the one comparator and the reference signal of the redundant comparator to update an offset control stored in a memory; and
   applying the updated offset control stored in the memory to the one comparator to correct an offset of the one comparator.

16. The method according to claim 15, wherein selecting the reference voltage of the one comparator of the plurality of parallel comparators as input to the redundant comparator comprises using a first MUX; and
   wherein selecting the output of the one comparator of the plurality of parallel comparators comprises using a second MUX.

17. The method according to claim 15, wherein applying the updated offset control stored in the memory to the one comparator to correct the offset of the one comparator comprises:

outputting a control word from the memory to an N-bit current steering digital-to-analog converter (DAC), wherein the N-bit current steering DAC injects static current to an output of a first preamp stage of the one comparator.

18. The method according to claim 15, further comprising:

performing the selecting of the reference voltage of one comparator of the plurality of parallel comparators as input to the redundant comparator, the selecting of the output of the one comparator of the plurality of parallel comparators, the comparing of the output of the one comparator and the reference signal of the redundant comparator using the FSM, the using of the result, and the applying of the updated offset control stored in the memory to the one comparator to correct an offset of the one comparator for each comparator of the plurality of parallel comparators.

19. The method according to claim 15, wherein comparing the output of the one comparator and the reference signal of the redundant comparator using the FSM comprises:

(a) setting an error sum variable to 0 and a counter variable to 0;
(b) comparing the output of the one comparator to the reference signal of the redundant comparator by subtracting the output of the one comparator from the reference signal of the redundant comparator;
(c) adding an error value of the subtracting of the output of the one comparator from the reference signal of the redundant comparator to the error sum variable;
(d) increasing the counter variable by 1; and
(e) repeating (b)-(d) until the counter variable is equal to a predetermined value.

20. The method according to claim 19, wherein using the result of the comparing of the output of the one comparator and the reference signal of the redundant comparator to update an offset control stored in the memory comprises:

extracting a polarity of the error sum variable; and
using the polarity of the error sum variable to determine how to update the offset control stored in a memory location corresponding to the one comparator.

* * * * *

UNITED STATES PATENT AND TRADEMARK OFFICE
CERTIFICATE OF CORRECTION

PATENT NO. : 8,330,632 B2 Page 1 of 1
APPLICATION NO. : 13/025855
DATED : December 11, 2012
INVENTOR(S) : Rizwan Bashirullah and Jikai Chen It is certified that error appears in the above-identified patent and that said Letters Patent is hereby corrected as shown below:

Column 3,
Line 19, "shows the CMI" should read --shows the CML--.

Column 5,
Line 9, "first preanip" should read --first preamp--.

Column 7,
Line 6, "VRET[1]" should read --VREF[1]--.

Column 8,
Line 20, "5-hit ADC" should read --5-bit ADC--.
Line 22, "0.13 μm hulk" should read --0.13 μm bulk--.

Column 10,
Lines 39-40, "sense-amplifier flip-flop (SAFE)"
should read --sense-amplifier flip-flop (SAFF)--.

Column 11,
Line 38, "1.20 Hz" should read --1.2 GHz--.

Column 14,
Line 21, "of the first atch" should read --of the first latch--.

Signed and Sealed this
Twelfth Day of March, 2013

Teresa Stanek Rea
*Acting Director of the United States Patent and Trademark Office*